(12) United States Patent
Thornton

(10) Patent No.: US 7,187,704 B2
(45) Date of Patent: Mar. 6, 2007

(54) FEEDBACK ENHANCED LASER

(76) Inventor: Robert L. Thornton, 19 E. Portola Ave., Los Altos, CA (US) 94022

( * ) Notice: Subject to any disclaimer, the term of this patent is extended or adjusted under 35 U.S.C. 154(b) by 224 days.

(21) Appl. No.: 10/872,024

(22) Filed: Jun. 17, 2004

(65) Prior Publication Data

US 2005/0008058 A1   Jan. 13, 2005

Related U.S. Application Data

(60) Provisional application No. 60/479,529, filed on Jun. 18, 2003.

(51) Int. Cl.
*H01S 3/08* (2006.01)
(52) U.S. Cl. .......................................... 372/92; 372/97
(58) Field of Classification Search ..................... None
See application file for complete search history.

(56) References Cited

U.S. PATENT DOCUMENTS 5,642,375 A * 6/1997 King et al. .................... 372/97
2002/0159487 A1 10/2002 Thornton et al.

OTHER PUBLICATIONS

Agrawal, Govind P. and Dutta, Niloy K.. Semiconductor Lasers, 2n ed., Van Nostrand Reinhold, New York, 1993, Chap. 6, "Rate Equations and Operating Characteristics." pp. 231-318.*

J.H. Osmundsen and N. Gade, "Influence of optical feedback on laser frequency spectrum and threshold conditions",IEEE Journal of Quantum Electronics, Mar. 1983, pp. 465-469, vol. QE-19, No. 3.*
Agrawal, Govind P. and Dutta, Niloy K., *Semiconductor Lasers*, 2nd ed., Van Nostrand Reinhold, New York, 1993, Chap. 6, "Rate Equations and Operating Characteristics," pp. 231-318.
Coldren, L. A. and Corzine, S. W., *Diode Lasers and Photonic Integrated Circuits*, John Wiley & Sons, Inc., New York, 1995, pp. 78-85 and 246-261.
U.S. Appl. No. 10/411,636 entitled "Control System for a Semiconductor Laser", filed Apr. 11, 2003.
N. Gade and J.H.Osmundsen, "Gain measurements on semiconductor lasers by optical . . . ", IEEE Journal of Quantum Electronics, Aug. 1983, pp. 1238-1242, vol. QE-19, No. 8.

(Continued)

*Primary Examiner*—James Menefee
(74) *Attorney, Agent, or Firm*—W. Douglas Carothers, Jr.

(57) ABSTRACT

A method of establishing the properties of a three-mirror laser, where the properties are the three mirror reflectivities and the two cavity lengths (i.e., the separations between the mirrors). Initially, a conventional two-mirror laser is designed, providing values for a laser cavity length and for power reflectivities of a high reflectance mirror and an effective mirror. Then, the effective mirror is replaced by a pair of mirrors with a separation equal to an external cavity length, and reflectivities that may be varied in tandem so that when the reflections from the pair of mirrors are in phase, the combined power reflectivity of the pair of mirrors is equal to that of the effective mirror. A quantity $\Gamma$ is defined to measure the relative shift in power reflectivity between the pair of mirrors. $\Gamma$ is varied over all its possible values, and various criteria are evaluated with respect to $\Gamma$.

22 Claims, 12 Drawing Sheets

OTHER PUBLICATIONS

N. Schunk and K. Petermann, "Stability analysis for laser diodes with short external cavities", IEEE Photonics Technology Letters, Mar. 1989, pp. 49-51, vol. 1, No. 3.

J. Heinrich and E. Zeeb, "Transverse modes under external feedback and fiber coupling . . . ", IEEE Photonics Technology Letters, Oct. 1998, pp. 1365-1367, vol. 10, No. 10.

K. Petermann, "External Optical feedback phenomena in semiconductor lasers", IEEE Journal of Selected Topics in Quantum Electronics, Jun. 1995, pp. 480-489, vol. 1, No. 2.

J.Y. Law and G.P. Agrawal, "Effects of optical feedback on static and . . . ", IEEE Journal of Selected Topics in Quantum Electronics, Apr. 1997, pp. 353-358, vol. 3, No. 2.

N: Schunk and K. Petermann, "Numerical analysis of the feedback regime for a single-mode . . . ", IEEE Journal of Quantum Electronics, Jul. 1988, pp. 1242-1247, vol. 24, No. 7.

P.S. Spencer, C.R. Mirasso and K.A. Shore, "Effect of strong optical feedback on verticle . . . ", IEEE Photonics Technology Letters, Feb. 1998, pp. 191-193, vol. 10, No. 2.

J. Helms, N. Schunk and K. Petermann, "Stable operation range for laser diodes with an . . . ", IEEE Photonics Technology Letters, Dec. 1989, pp. 409-411, vol. 1, No. 12.

J.H. Osmundsen and N. Gade, "Influence of optical feedback on laser frequency spectrum . . . ", IEEE Journal of Quantum Electronics, Mar. 1983, pp. 465-469, vol. QE-19, No. 3.

A. Valle, L. Pesquera and K.A. Shore, "Polarization selection and sensitivity of external cavity . . . ", IEEE Photonics Technology Letters, May 1998, pp. 639-641, vol. 10, No. 5.

G.E. Giudice, D.V. Kuksenkov, L. Grave De Peralta and H. Temkin, "Single-mode operation . . . ", IEEE Photonics Technology Letters, Dec. 1999, pp. 1545-1547, vol. 11, No. 12.

R. Lang and K. Kobayashi, "External optical feedback effects on semiconductor injection . . . ", IEEE Journal of Quantum Electronics, Mar. 1980, pp. 347-355, vol. QE-16, No. 3.

J. Mørk and B. Tromborg, "The mechanism of mode selection for an external cavity laser", IEEE Photonics Technology Letters, Jan. 1990, pp. 21-23, vol. 2, No. 1.

* cited by examiner

FEEDBACK ENHANCED LASER

CROSS-REFERENCES TO RELATED APPLICATIONS

This application claims the benefit of U.S. Provisional Patent Application No. 60/479,529, filed Jun. 18, 2003 which is hereby incorporated herein in its entirety by reference thereto.

BACKGROUND OF THE INVENTION

1. Field of the Invention

The present invention relates generally to lasers, and in particular, to semiconductor lasers subjected to modulation.

2. Description of Related Art

Semiconductor lasers have widespread uses across a variety of fields, such as optical data storage, laser pointers, medical sensing and diagnostics, and telecommunications. The relatively low voltage requirements, small size, and reduced cost make semiconductor lasers an ideal replacement for gas lasers in many applications.

Optical feedback may significantly affect the performance of a semiconductor laser. If a fraction of the light exiting a semiconductor laser cavity is reflected back into the cavity, the effects may be undesirable, leading to an increase in noise, chaotic operation, or broadened linewidth. Generally, an optical system is designed to reduce optical feedback wherever possible. For example, fibers and gradient index lenses used in a fiber-based telecommunications system have the ends polished at an angle, so that any light reflected off the polished ends is directed away from the laser.

Under certain conditions, optical feedback is deliberately used to affect the laser performance. For example, a diffraction grating is incorporated into a laser cavity to provide feedback only at a particular desirable wavelength. The laser uses this feedback to stabilize its performance with respect to external variables, such as variations in temperature. Although this example uses an optical element placed inside the optical cavity, a suitable design may alternatively use an optical element external to the laser cavity to stabilize performance.

A common and often undesirable feature of a laser is called chirp, which is a change in wavelength in the presence of intensity modulation. Chirp is observed most commonly in the output of pulsed lasers, where the leading and trailing edges of the pulse (in time) may have different wavelengths. Chirp may generally be found whenever the stimulated emission rate within the laser cavity is changed in order to change the emission intensity. Many applications, such as optical data storage, routinely require switching among various predetermined output power levels. In most cases, it is desirable that a constant wavelength be maintained from the laser, even as the output power is varied from level to level. For example, in a telecommunications system in which the laser light is coupled into a fiber and propagated over a great distance in the fiber, the fiber has a naturally occurring dispersion, in which light of different wavelengths propagates at different speeds. If a series of chirped pulses is transmitted along the fiber, the shape of the pulses will distort as the beam propagates, leading to a degradation of the transmitted signal. Therefore, it is generally desirable that the chirp of the laser should be reduced.

A vertical cavity surface emitting laser (VCSEL) is a particularly desirable type of laser, compared to a more common edge-emitting laser, for primarily three reasons. First, a VCSEL has a circularly symmetric output beam, which couples efficiently into an optical fiber. In contrast, an edge-emitting laser has an asymmetric output beam, which inherently couples less efficiently into a fiber. Second, VCSELs are produced and tested in wafer form, in contrast with edge-emitters, which are tested one isolated unit at a time. VCSELs are therefore inherently less expensive than edge-emitters. Third, VCSELs have a shorter cavity length than comparable edge-emitters, and as a result, may be more readily adapted to wavelength stabilization techniques. A potential drawback to VCSELs is that their output power is generally less than edge-emitting lasers.

In U.S. Patent Application No. 2002/0159487 A1 (referred to as '487), a light source is disclosed for use in optical communications systems. In one aspect, a gain region defined by a first and second mirror is provided having a corresponding resonant mode, and an external cavity defined by a third mirror and the second mirror is also provided having a plurality of resonant modes. The second mirror is configured such that one of the external cavity resonant modes is selected. The laser preferably has wavelength precision sufficient to eliminate the need for an external wavelocker, and is capable of being directly modulated in an essentially chirp-free manner.

However, the '487 patent fails to specify the values of the numerous specific design parameters required to realize a functional system while avoiding the undesirable effect of noise enhancement and chaotic operation. The '487 patent discusses an external cavity feedback system that is used for producing a laser beam that has reduced chirp. Unfortunately, establishing suitable values for the various parameters to obtain properly operating VCSELs under a variety of conditions is problematic.

Although there are numerous examples in the prior art of VCSEL type devices with three mirror cavities applied, for purposes of increased power output capability, or for more scientific purposes of understanding the stability of VCSELs in the presence of external feedback, these devices do not have desirable chirp characteristics.

BRIEF SUMMARY OF THE INVENTION

One advantage of this invention is to realize enhanced functionality semiconductor lasers through the influence of an external cavity. Another advantage is to provide a set of algorithms for realizing lasers with reduced chirp. Another advantage is to provide a set of algorithms for realizing a modulated external cavity laser with optimized spectral response.

One embodiment is a method of defining a three-mirror laser having a laser cavity and an external cavity, the laser cavity comprising a first mirror and a second mirror, and the external cavity comprising the second mirror and a third mirror, the method comprising: specifying a precursor laser having a high reflectivity mirror of power reflectivity $R_1$, an effective mirror of power reflectivity $R_{max}$, and a length $L_1$; establishing a length $L_2$ of the external cavity; establishing $\Gamma$ for the external cavity; and calculating a power reflectivity $R_2$ for the second mirror and a power reflectivity $R_3$ for the third mirror from the $\Gamma$ and the power reflectivity $R_{max}$; wherein the three-mirror laser is defined by the values of $L_1$, $L_2$, $R_1$, $R_2$ and $R_3$.

A further embodiment is a method of defining a three-mirror laser having a laser cavity and an external cavity, the laser cavity comprising a first mirror and a second mirror, and the external cavity comprising the second mirror and a third mirror, the method comprising: specifying a precursor laser having a high reflectivity mirror of power reflectivity $R_1$, an effective mirror of power reflectivity $R_{max}$, and a length $L_1$; establishing a length $L_2$ of the external cavity; obtaining a first range of $\Gamma$ values for which a chirp reduction factor is acceptable; obtaining a second range of $\Gamma$ values for which a Side Mode Suppression Ratio ("SMSR") is acceptable; obtaining a third range of $\Gamma$ values for which a phase sensitivity is acceptable; obtaining a fourth range of $\Gamma$ values for which phase instability is enhanced; identifiying $\Gamma$ values common to the first, second and third ranges, excluding $\Gamma$ values in the fourth range; selecting the $\Gamma$ from the common $\Gamma$ values; calculating a power reflectivity $R_2$ for the second mirror equals the second mirror equals $$\left| 1 + \left(\frac{\Gamma}{1-\Gamma}\right)^{1/2} - \left(\frac{\left(\frac{\Gamma}{1-\Gamma}\right)^{1/2} - 2\Gamma + 4\Gamma R_{max}}{\left(\frac{\Gamma}{1-\Gamma}\right)^{1/2}(\Gamma-1)}\right)^{1/2} \right|^2 ;$$

and calculating a and calculating a power reflectivity $R_3$ for the third mirror equals $$\left| 1 + \left(\frac{1-\Gamma}{\Gamma}\right)^{1/2} - \left(\frac{\left(\frac{\Gamma}{1-\Gamma}\right)^{1/2} - 2\Gamma + 4\Gamma R_{max}}{\Gamma\left(\frac{\Gamma}{1-\Gamma}\right)^{1/2}}\right)^{1/2} \right|^2 ;$$

wherein the three-mirror laser is defined by wherein the three-mirror laser is defined by the value of $L_1$, $L_2$, $R_2$, and $R_3$.

A further embodiment is a method of defining a three-mirror laser having a laser cavity and an external cavity, the laser cavity comprising a first mirror and a second mirror, and the external cavity comprising the second mirror and a third mirror, the method comprising: specifying a precursor laser having a high reflectivity mirror of power reflectivity $R_1$, an effective mirror of power reflectivity $R_{max}$, and a length $L_1$; establishing a length $L_2$ of the external cavity; obtaining a range of $\Gamma$ values for which a Side Mode Suppression Ratio ("SMSR") is acceptable; selecting the $\Gamma$ from the range of $\Gamma$ values; calculating a power reflectivity $R_2$ for the second mirror equals A further embodiment is a method of defining a three-mirror laser having a laser cavity and an external cavity, the laser cavity comprising a first mirror and a second mirror, and the external cavity comprising the second mirror and a third mirror, the method comprising: specifying a precursor laser having a high reflectivity mirror of power reflectivity $R_1$, an effective mirror of power reflectivity $R_{max}$, and a length $L_1$; establishing a length $L_2$ of the external cavity; obtaining a range of $\Gamma$ values for which a Side Mode Suppression Ratio ("SMSR") is acceptable; selecting the $\Gamma$ from the range of $\Gamma$ values; calculating a power reflectivity $R_2$ for the second mirror equals reflectivity $R_2$ for the second mirror equals $$\left| 1 + \left(\frac{\Gamma}{1-\Gamma}\right)^{1/2} - \left(\frac{\left(\frac{\Gamma}{1-\Gamma}\right)^{1/2} - 2\Gamma + 4\Gamma R_{max}}{\left(\frac{\Gamma}{1-\Gamma}\right)^{1/2}(\Gamma-1)}\right)^{1/2} \right|^2 ;$$

and calculating a power refectivity $R_3$ for the third mirror equals $$\left| 1 + \left(\frac{1-\Gamma}{\Gamma}\right)^{1/2} - \left(\frac{\left(\frac{\Gamma}{1-\Gamma}\right)^{1/2} - 2\Gamma + 4\Gamma R_{max}}{\Gamma\left(\frac{\Gamma}{1-\Gamma}\right)^{1/2}}\right)^{1/2} \right|^2 ;$$

wherein the three-mirror laser is defined by wherein the three-mirror laser is defined by the values of $L_1$, $L_2$, $R_1$, $R_2$, and $R_3$.

A further embodiment is a method of defining a three-mirror laser comprising: establishing a laser cavity having a length $L_1$ and comprising a first mirror of power reflectivity $R_1$ and a second mirror; establishing an external cavity having a length $L_2$ and comprising the second mirror and a third mirror; determining the power reflectivities $R_2$ and $R_3$ by rate equations that are valid for any arbitrary level of optical feedback.

A further embodiment is a vertical cavity surface emitting laser comprising: a vertical laser cavity having a length $L_1$ and comprising a high reflectivity first mirror of power reflectivity $R_1$ and a second mirror of power reflectivity $R_2$; a vertical external cavity having a $\Gamma$ value and a length $L_2$ and comprising the second mirror and a third mirror of power reflectivity $R_3$; wherein the power reflectivity $R_2$ and the power reflectivity $R_3$ are functions of the $\Gamma$ value and a power reflectivity $R_{max}$ determined for a precursor two mirror laser having the first mirror and an effective mirror of the power reflectivity $R_{max}$.

A further embodiment is a three-mirror laser comprising: a laser cavity having a length $L_1$ and comprising a first mirror of power reflectivity $R_1$ and a second mirror of power reflectivity $R_2$; and an external cavity having a length $L_2$ and comprising the second mirror and a third mirror of power reflectivity $R_3$; wherein the power reflectivities $R_2$ and $R_3$ are at least in part determined by rate equations that are valid for any arbitrary level of optical feedback.

DETAILED DESCRIPTION OF THE INVENTION

Figure 1:
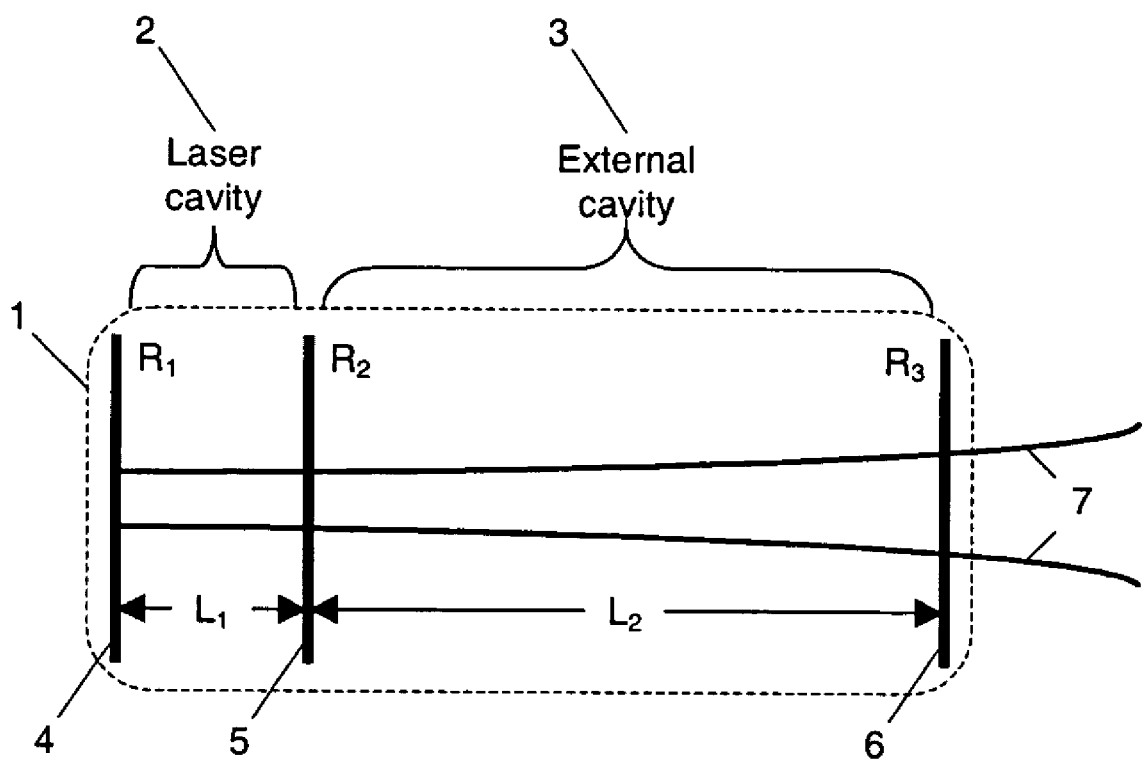
FIG. 1 is a schematic diagram of a three-mirror laser.

A three-mirror laser 1 is shown schematically in FIG. 1. A laser cavity 2 has a first mirror 4 with power reflectivity $R_1$, a second mirror 5 with power reflectivity $R_2$, and the region between them, which preferably contains a gain medium (not shown). The first mirror 4 and second mirror 5 are spaced apart by a distance $L_1$. Adjacent to the laser cavity 2 is an external cavity 3, which has the second mirror 5, a third mirror 6, and the region between them. Preferably, there is no gain medium in the external cavity 3. The second mirror 5 and third mirror 6 are spaced apart by a distance $L_2$. A laser beam 7 is shown to emerge from the third mirror 6, which preferably is only partially reflecting.

For a vertical cavity laser, the three mirrors in the laser 1 may be manufactured as thin-film stacks or multilayers, which are well-known in the art, and may be tuned to any desired power reflectivities between nearly 0% and nearly 100%. The thin films may also contain wavelength-selective characteristics. The thin films are preferentially non-absorbing. Note that for non-absorbing optical elements, the power reflectivity and the power transmissivity generally sum to 100%.

The laser cavity 2 may be grown in wafer form in which the gain medium is formed as a layer or set of layers, and may contain more layers in addition to the gain layer, in order to enhance or stabilize the laser performance. Additionally, the first mirror 4 and second mirror 5 may be grown as thin film stacks directly on the ends of the laser cavity 2. Once the materials are grown, they may be tested in wafer form, then diced into the required shapes for individual devices. The external cavity 3 and third mirror 6 may be grown on the same wafer, or may be grown on a separate wafer and then bonded to the wafer containing the laser cavity 2. Suitable wafer processing techniques are well known in the art. Alternatively the external cavity may contain an external optical element, such as a plano-concave lens, gradient index (GRIN) lens, or a short segment of optical fiber, one surface of which faces the laser cavity 2, and upon the other surface of which is placed the third mirror 6.

Preferably, the laser cavity 2 is a vertical cavity surface emitting laser, or VCSEL. Alternatively, the three mirrors 4, 5 and 6 may be discrete optical elements, and may be placed and aligned as discrete components. The techniques described herein work equally well, regardless of the physical embodiment of the mirrors and cavities.

The laser beam 7 is shown to diverge upon exiting the laser 1. While this is generally the case for most lasers, the specific shape and size of the beam as it emerges from the laser 1 are determined by the gain profile inside the laser cavity 2, as well as the curvatures and spacings of the three mirrors. In FIG. 1, the three mirrors are drawn as planar, but they may have curvatures, depending on the specific laser design. The beam is also drawn with a waist at the first mirror 4 in FIG. 1, but the beam waist may occur at any point along the beam, depending on the specific laser design. Alternatively, any of the regions between the mirrors may be formed by regions of optical waveguide effects, in which the beam maintains a fixed width, or is otherwise confined by optical waveguiding.

Finally, it should be noted that FIG. 1 omits all of the mechanical packaging and electrical feeds that go into the laser 1, which are used for stable operation of a laser, but are not relevant to the techniques described herein.

The prior art laser 1 has five primary design parameters: the laser cavity length $L_1$, the external cavity length $L_2$, and the power reflectivities of the first, second and third mirrors, $R_1$, $R_2$ and $R_3$, respectively. These design parameters are disclosed in U.S. Patent Application Publication 2002/0159487 A1, published Oct. 31, 2002, which hereby is incorporated in its entirety by reference thereto.

Figure 2:
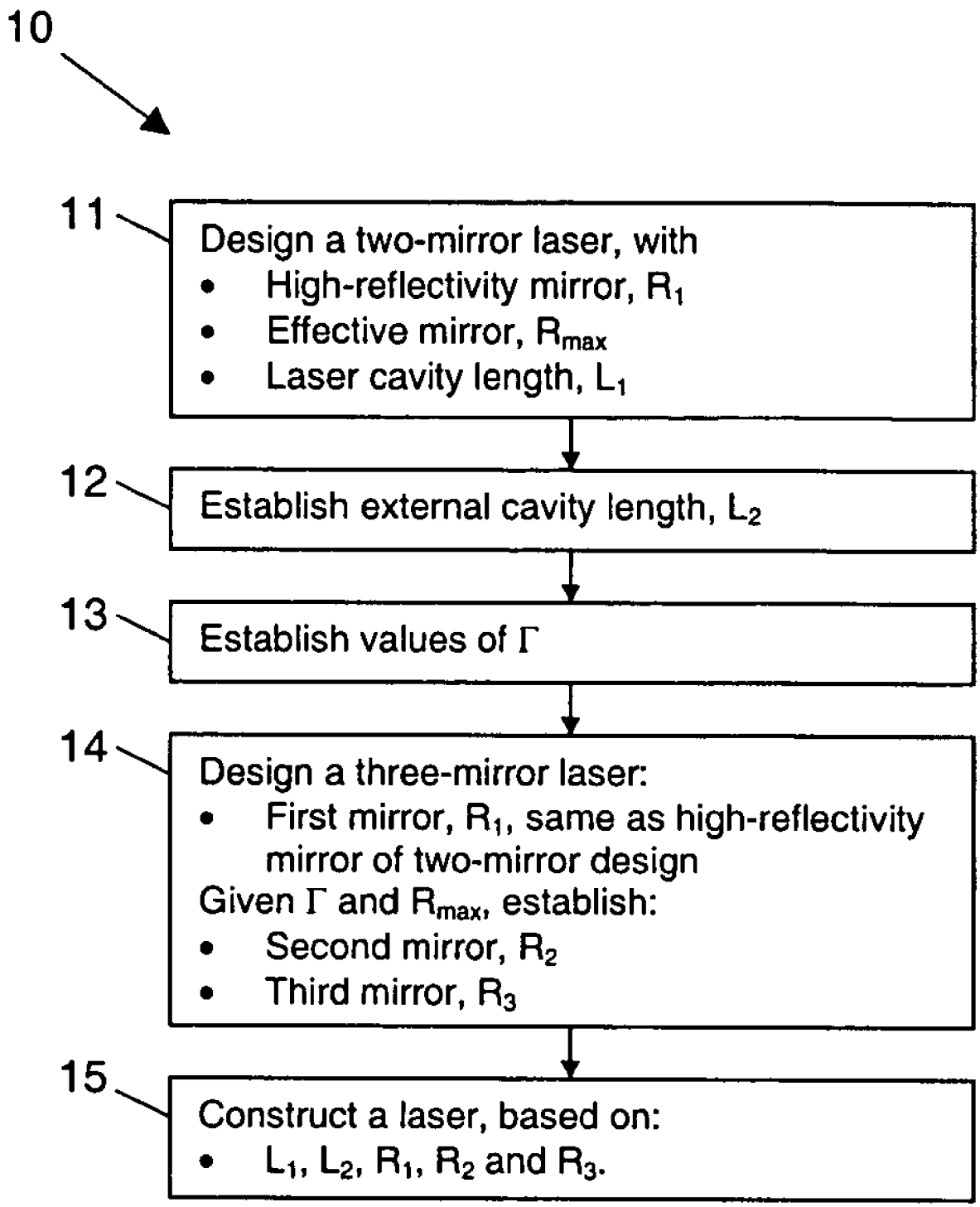
FIG. 2 is a flow chart of a process in accordance with the present invention by which a three-mirror laser may be constructed.
Figure 3:
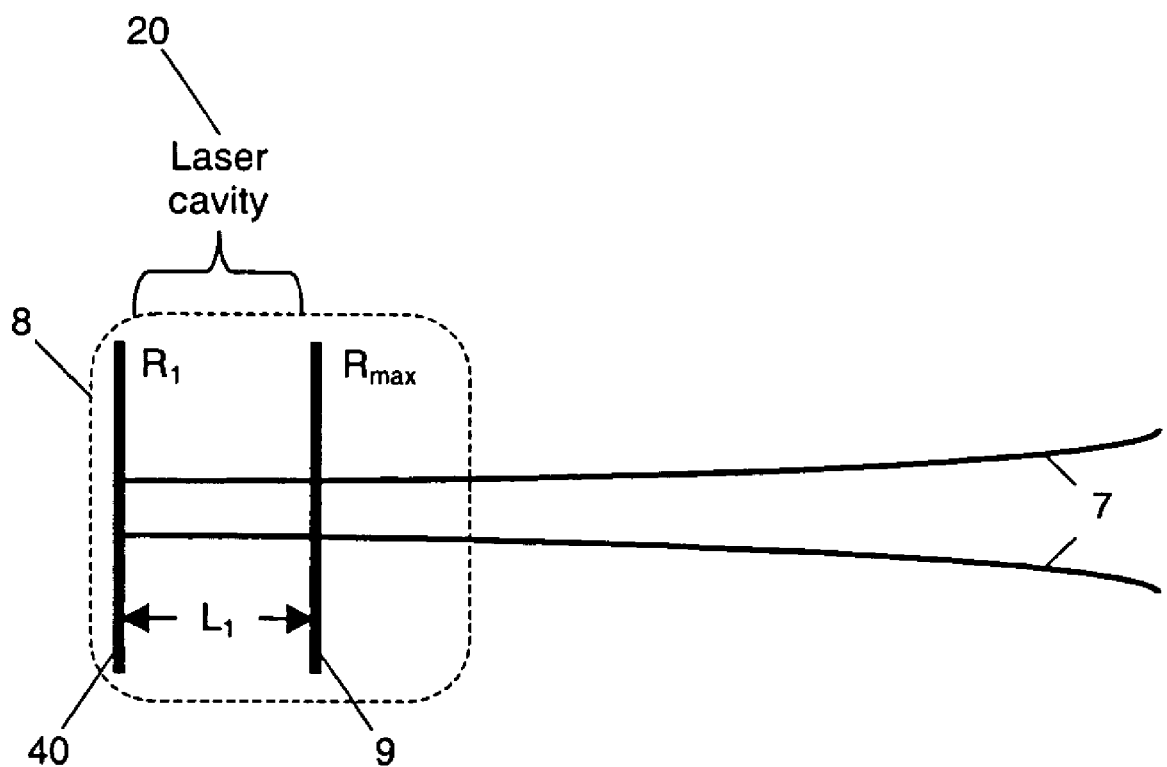
FIG. 3 is a schematic diagram of a two-mirror laser.

FIG. 2 shows a flow chart in accordance with the present invention that sets out a process 10 used to establish values for the critical parameters of a three-mirror laser 1. The first block 11 is to design a two-mirror laser 8, shown schematically in FIG. 3, in a conventional manner well known in the art. Generally, the cavity length and mirror reflectivities for the two-mirror laser 8 are determined by the optimum design of the device for power output performance under laser operation. A two-mirror laser 8 has a laser cavity 20. The laser cavity 20 has a high-reflectivity mirror 40 with power reflectivity $R_1$, an effective mirror 9 with power reflectivity $R_{max}$, and the region between them, which generally contains a gain medium (not shown). The high-reflectivity mirror 40 and effective mirror 9 are spaced apart by a distance $L_1$.

Block 12 establishes an external cavity length $L_2$.

Figure 4:
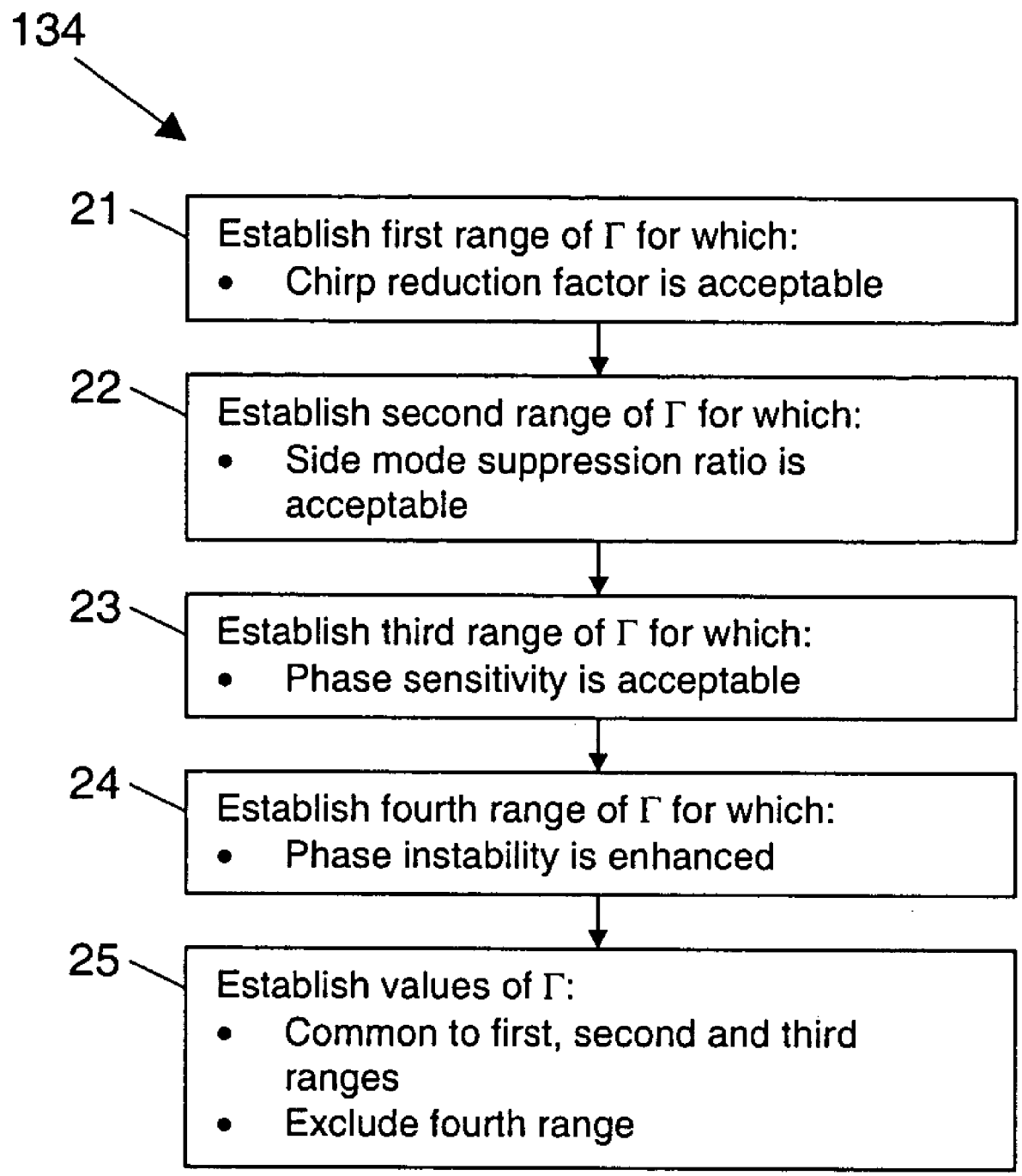
FIG. 4 is a flow chart of a process in accordance with the present invention by which values of $\Gamma$ are established, for making a laser that has reduced chirp.
Figure 5:
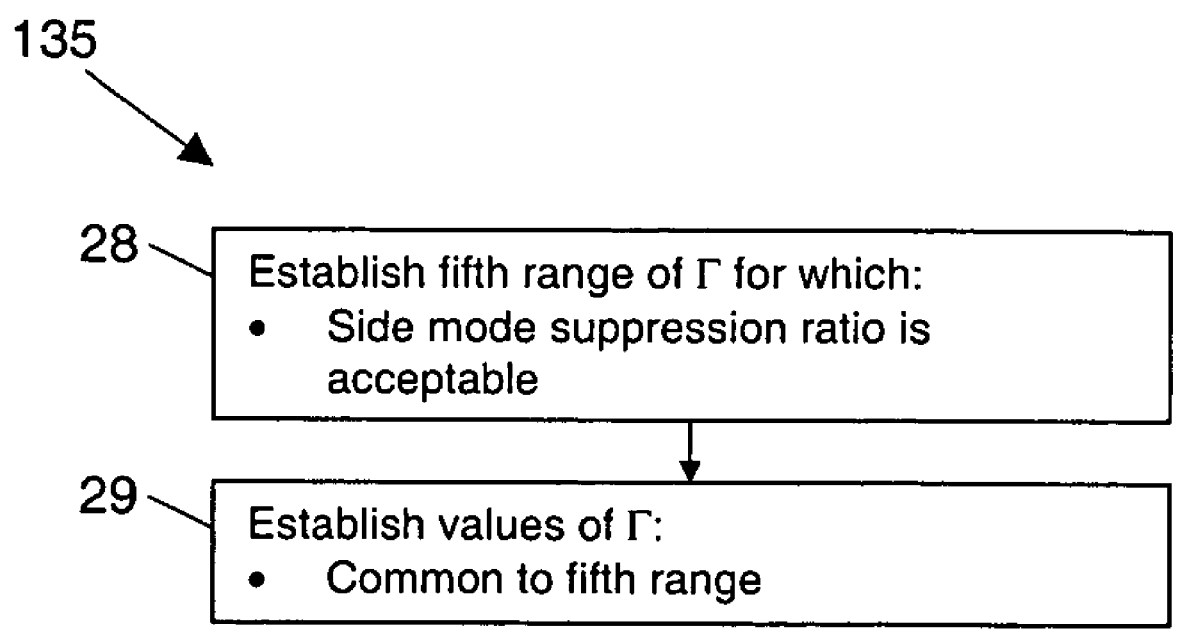
FIG. 5 is a flow chart of a process in accordance with the present invention by which values of $\Gamma$ are established, for making a laser that may be mode locked.

Block 13 establishes values for $\Gamma$, a parameter that determines the relative reflectivities $R_2$ and $R_3$ of the second mirror 5 and third mirror 6, respectively. Block 13 has several different embodiments, which depend on the desired function of the laser being designed. Two exemplary embodiments of block 13 are presented: one in which the three-mirror laser 1 is designed for reduced chirp (FIG. 4), and one for mode locking (FIG. 5).

Block 14 uses the two-mirror laser 8 design, in combination with $\Gamma$ and $R_{max}$, to establish values for the critical parameters of the three-mirror laser 1.

Finally, a three-mirror laser 1 is constructed, based on the parameter values established in block 14.

Each of the blocks is treated in much greater detail in the following paragraphs.

First, consider in detail block 11, in which a precursor two-mirror laser is designed. The two-mirror laser design is the basis for a three-mirror laser in further design blocks.

The derivation of a set of rate equations that are valid for an arbitrary amount of feedback is presented below. By following the two-mirror laser design principles well known to one skilled in the art, we can arrive at a design for a two-mirror laser 8, shown schematically in FIG. 3. The two mirrors are referred to as a high-reflectivity mirror 40 and an effective mirror 9.

The high-reflectivity mirror 40 has a high reflectivity $R_1$, typically as close to 100% as possible. The first mirror 4 of the three-mirror laser 1 replaces the high-reflectivity mirror 40 of the two-mirror laser 8 design, and preferably has the same value of power reflectivity, $R_1$. In the three-mirror laser 1, the second mirror 5 and the third mirror 6 replace the effective mirror 9 of the two-mirror laser 8 design. The reflectivity $R_{max}$ of the effective mirror 9 is distributed between the second mirror 5 and the third mirror 6. The spacing $L_1$ between the mirrors in the laser cavity 2 preferably is the same for both the two-mirror laser 8 design and three-mirror laser 1.

From the derivations in below of the rate equations and calculation of the longitudinal mode frequencies, one arrives at a relationship among the laser power P, the optical frequency ω, the effective mirror power reflectivity $R_{max}$, and the laser cavity length $L_1$. The derivations result in a transcendental equation, which is generally solved numerically by techniques well known in the art.

Once the laser cavity length $L_1$ and the effective mirror power reflectivity $R_{max}$ are determined, most of the remaining design blocks are directed toward replacing the effective mirror 9 with a combination of a second mirror 5 and a third mirror 6, and to do so in a manner which provides for a specific enhancement to the performance of the laser.

The physics of such a replacement is as follows. Reflections from the second mirror 5 and third mirror 6 add coherently, and repeated bounces between the two are treated accurately by the same techniques used in thin-film theory. Because the reflected contributions add coherently, they are sensitive to any changes in optical path length between the mirrors.

The mirror replacement is based on the following principle: the power reflectivity $R_{max}$ of the effective mirror 9 is distributed between the second mirror 5 and the third mirror 6, so that when the mirror reflections are in phase (i.e., the reflection from the third mirror back toward the laser cavity arrives at the first mirror in phase with the reflection from second mirror), the fraction of power reflected back into the laser cavity 2 is the same for both the two-mirror laser 8 design and the three-mirror laser 1 design.

The degree of relative reflectivity distribution is given by a quantity Γ, defined by $$\Gamma = R_3/(R_2 + R_3) \quad (1)$$

where $R_2$ and $R_3$ are the power reflectivities of the second and third mirrors. When Γ=0, all the reflectivity is in the second mirror. When Γ=0.5, the reflectivities of the second and third mirrors are equal. When Γ=1, all the reflectivity is in the third mirror. In many of the further design blocks, Γ is cycled through all its possible values, between 0 and 1, in order to evaluate the performance of the resulting three-mirror laser 1 under all potential designs. Once various criteria are evaluated for the values of Γ, a value of Γ is chosen that preferably satisfies them all simultaneously.

Because the reflections from the second mirror 5 and third mirror 6 are coherent, the phase difference between their reflections is also an important quantity. The phase relationship between these reflections is dependent on the optical frequency of the light emission and the optical path length of the optical cavity. Consequently, we consider a case where the desired frequency of operation is determined by a resonance of the initial laser cavity, and define the external cavity to be "in phase" when the in-phase back reflection criterion is satisfied for the cavity $L_2$ at the frequency of the resonance of cavity $L_1$. Thus, when the mirror reflections are in phase, the amount of power reflected by the mirror combination is $R_{max}$. When the phase difference is anything but zero mod 2π, the amount of reflected light is reduced from its maximum value, reaching a minimum value when the two reflections are out of phase. One or more of the criteria may optionally be evaluated for both the in-phase and the out-of-phase condition, which may demonstrate that either the criteria are insensitive to phase, or alternatively that the criteria are extremely sensitive to phase and a certain part of the design space should be avoided because of it if the particular criterion evaluated is one that is critical to the laser performance.

Next, consider in detail block 12, in which a length $L_2$ of the external cavity is established. For a typical data transmission system, in which laser chirp is preferably reduced, the external cavity length $L_2$ is chosen based on two criteria. First, the round trip time of the external cavity should be less than the shortest bit length to be used, preferably by a factor of 10. For example, if data is transmitted at 10 GHz, then the shortest bit used for transmission is 100 picoseconds, and the round trip time of the external cavity should be less than 10 picoseconds. For an external cavity filled with a material of refractive index n (n=1 in air), the external cavity length $L_2$ should be less than 1.5 millimeters divided by the refractive index.

Second, the external cavity length $L_2$ should be longer than the laser cavity length $L_1$, preferably by a factor of 100. This ensures that the external cavity mode spacing has a substantial reductive effect on the laser wavelength variation when the laser is modulated.

Any value of $L_2$ that satisfies the above two criteria simultaneously is suitable. It is generally the case, particularly for high data rates of 2.5 Gb/sec and greater, that these two criteria are more readily simultaneously satisfied for a typical vertical cavity laser than they are for a typical edge emitting laser. This is a result of the far shorter cavity length of the laser cavity in the case of the vertical cavity laser. Once a value of $L_2$ is chosen, we may graphically plot the permissible longitudinal modes of the three-mirror laser 1, as predicted by the equations derived below.

Figure 6:
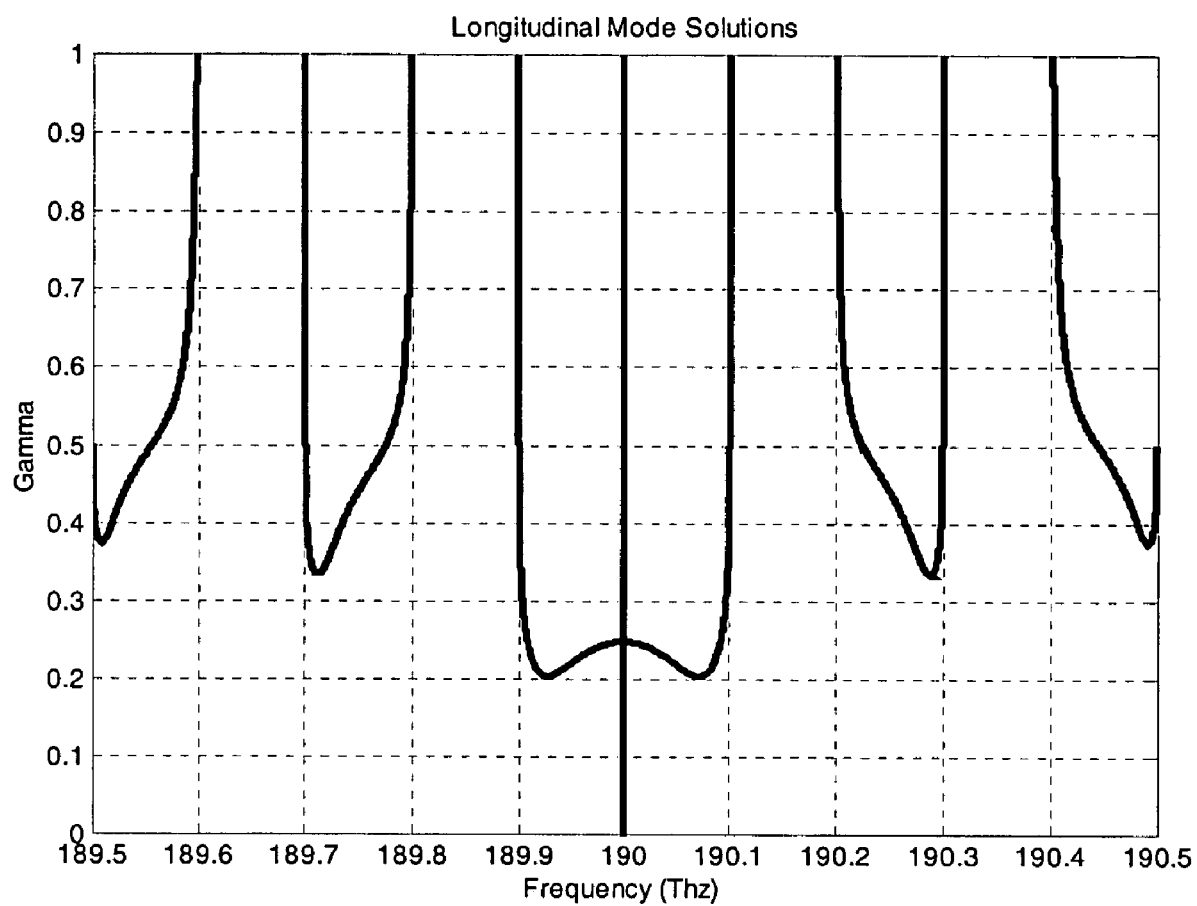
FIG. 6 is an illustrative graph of permissible longitudinal modes, as a function of optical frequency and $\Gamma$.

An illustrative graph of permissible longitudinal modes is shown in FIG. 6. For this sample plot, and the remainder of the sample plots shown in the figures, the following parameters are used as nonlimiting examples: the power reflectivity $R_1$ of the first mirror 1 is 0.999, the power reflectivity $R_{max}$ of the effective mirror 9 is 0.995, the length $L_1$ of the laser cavity 2 is $6.311 \times 10^{-6}$ m, the length $L_2$ of the external cavity 3 is $1499 \times 10^{-6}$ m, the refractive indices of both the laser cavity and the external cavity are 1, the linewidth enhancement factor α is 4, the spontaneous emission rate $R_{sp}$ is $2 \times 10^{29}$ m$^{-3}$ sec$^{-1}$, the output power $P_{m,out}$ from the m$^{th}$ longitudinal mode is $1 \times 10^{-3}$ W, the active region length $A_{length}$ is $1 \times 10^{-6}$ m, the active region width $A_{width}$ is $1 \times 10^{-6}$ m, and the active region thickness $A_{thickness}$ is $2.4 \times 10^{-8}$ m.

The plot of FIG. 6 is in the same format as is used in the remainder of the plots: the optical frequency increases from left to right along the x-axis, and Γ increases from 0 to 1 along the y-axis. In FIG. 6, the curves show the locus of all possible longitudinal modes for a three-mirror laser 1 with the numerical values given above. The fundamental mode of the gain cavity operates at an optical frequency of $190 \times 10^{12}$ Hz, or 190 THz, which corresponds to a wavelength of 1578 nm. For Γ=1, at the top of the plot, the longitudinal mode spacing is $0.1 \times 10^{12}$ Hz, or 0.1 THz. Note that for large Γ, the longitudinal mode spacing is largely determined by the external cavity length $L_2$, and is well approximated numerically as $c/(2 \times L_2)$. As Γ decreases to zero, the effect of the external cavity decreases, gradually reducing the number of external cavity modes and modifying their spacing, until at $\Gamma=0$, there is effectively no external cavity at all (because $R_3=0$). Note that at $\Gamma=0$, the longitudinal mode spacing depends on the laser cavity length $L_1$, and is well approximated as $c/(2\times L_1)$. For the numerical values given above, which are consistent with a vertical cavity laser device, the mode spacing for the laser cavity alone is 23.75 THz, which corresponds in wavelength to roughly +/−200 nm. In practice, the thin film coatings used on the laser cavity mirrors are wavelength selective, and may easily be tuned to one particular longitudinal mode of the laser cavity while suppressing all others. Furthermore, the spectral bandwidth over which the laser cavity exhibits gain is typically between 20 nm and 50 nm, which is also significantly narrower than the mode spacing. For these reasons, we treat here the laser where the laser cavity without feedback accommodates only a single longitudinal mode. However, the numerical analysis we present may also be applied to the more complicated case of the edge-emitting laser when there are multiple longitudinal modes of the gain cavity under consideration. Note that the curves of FIG. 6 are superimposed on the plots in FIGS. 7, 8 and 10.

Next, consider in detail block 13, in which values of $\Gamma$ are established. Once the effective mirror 9 power reflectivity $R_{max}$ has been established from block 11, and the external cavity 3 length $L_2$ has been established from block 12, the remaining two parameters in the three-mirror laser 1 design, namely the power reflectivities $R_2$ and $R_3$ of the second mirror 5 and the third mirror 6, may both be determined by a choice of $\Gamma$. $\Gamma$ may take on any value between 0 and 1, inclusive, and any physically possible combination of reflectivities $R_2$ and $R_3$ lie in that range. If we evaluate various criteria in terms of $\Gamma$, we effectively map out the entire design space by varying $\Gamma$ in small increments from 0 to 1. $\Gamma$ becomes a convenient independent variable during the analysis, and once a value or range of values for $\Gamma$ is appropriately established, the reflectivities $R_2$ and $R_3$ are easily calculated (block 14).

The choice of which criteria to evaluate in terms of $\Gamma$ depends on the ultimate use of the laser. Two such examples are presented here, and these are intended only to be exemplary; it will be appreciated that other intents will require a different set of criteria for evaluation.

For a first embodiment of block 13, consider the reduction of chirp. FIG. 4 shows a flow chart specifying the details 134 for the reduction of chirp. The blocks of FIG. 4 are detailed below.

First, consider in detail block 21, in which a first range of $\Gamma$ values is established for which a chirp reduction factor is acceptable.

From the rate equations presented below, one may follow the small signal approach of Agrawal and Dutta (in Chapter 6 of Semiconductor Lasers, $2^{nd}$ edition, 1993), incorporated herein in its entirety by reference, to derive a chirp reduction factor M, given by:

$$M = 1 + \frac{\beta_c v_g}{4L} \frac{\partial \ln(z)}{\partial \omega} - \frac{c}{2L\mu} \frac{\partial \arg(z)}{\partial \omega}\bigg|_{\omega=\omega_0} \quad (2)$$

where $\beta_c$ is the dimensionless linewidth enhancement factor, $v_g$ is the group velocity [m/sec], L is the cavity length [m], z is the dimensionless feedback parameter, $\omega$ is the instantaneous frequency of operation [radians/sec], c is the speed of light in a vacuum [m/sec], and $\mu$ is the dimensionless permeability of the laser cavity.

When a value of M greater than roughly 100 is obtained, the chirp of the laser is sufficiently small, for a typical modulation at 10 GHz. For a given laser frequency $\omega$, one finds a range of values of $\Gamma$ that produce a value of M greater than roughly 100.

In general, chirp reduction is considered adequate when the variation in laser wavelength due to the modulation becomes insignificant relative to the intrinsic spread in wavelengths that results from the data modulation rate. For instance, modulation at 10 GHz inevitably spreads the frequency spectrum of the signal over a range of approximately 10 GHz. When the frequency excursions due to chirp are reduced to substantially below this value, there is little additional benefit to be gained from additional chirp reduction.

Figure 7A:
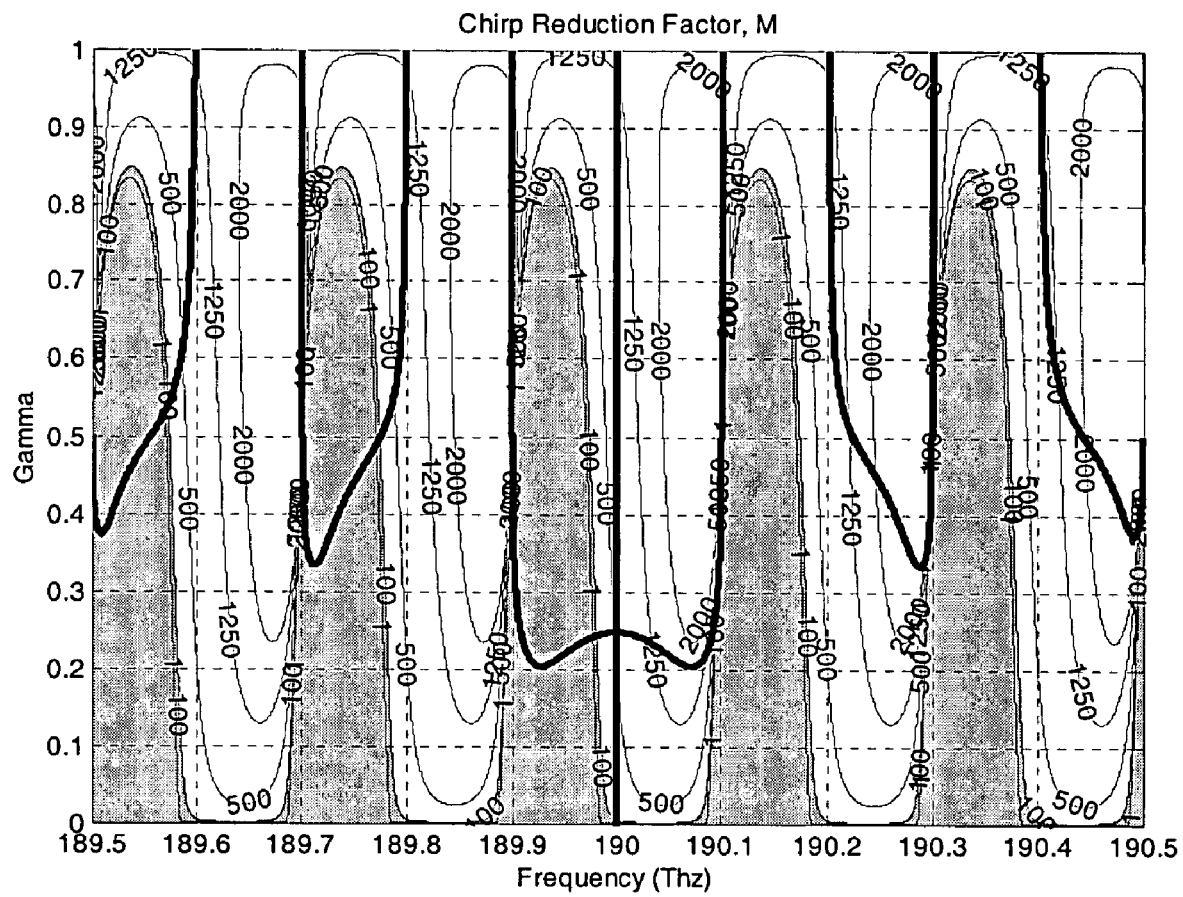
FIG. 7a is an illustrative contour plot of chirp reduction factor, as a function of optical frequency and $\Gamma$.
Figure 7B:
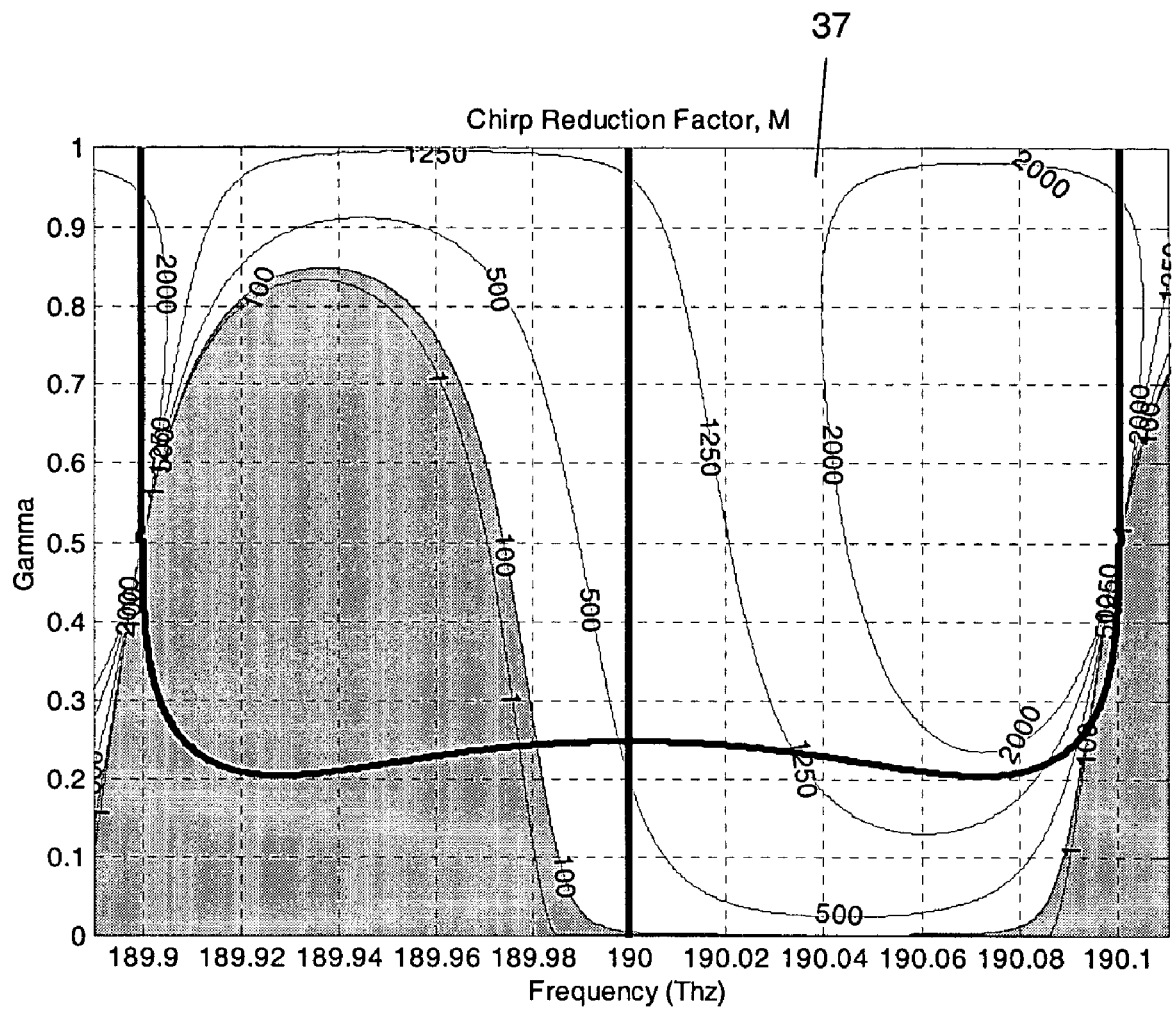
FIG. 7b is an expanded illustrative contour plot of chirp reduction factor, as a function of optical frequency and $\Gamma$, over a narrow range of frequency around the primary emission frequency.

A helpful device to identify the acceptable regions of M is a contour plot. One may plot contours of M, with laser frequency $\omega$ along an x-axis, and $\Gamma$ varying from 0 to 1 along a y-axis. A sample contour plot is shown in FIGS. 7a and 7b, with an acceptable region 37 chosen to be when M is greater than or equal to 100. FIG. 7b shows the plot of FIG. 7a expanded to cover a narrow span of frequencies near the primary emission frequency, in order to more clearly identify the contours corresponding to given values of M. Note that the acceptable region 37 indicates an acceptable range of $\Gamma$ values for each laser frequency $\omega$, which defines the first range of $\Gamma$ values.

Next, consider in detail block 22, in which a second range of $\Gamma$ values is established for which a side mode suppression ratio is acceptable. From the rate equations presented in Appendix A, we may treat the spontaneous emission rate and gain as being constant over the spectral bandwidth corresponding to the set of laser modes, and arrive at an expression for a side mode suppression ratio SMSR:

$$SMSR = \frac{P_{m,out}}{P_{n,out}} \quad (3)$$
$$= \frac{\log_e(r_1 r_2 / z_m)}{\log_e(r_1 r_2 / z_n)} + \frac{P_{m,out}}{R_{sp}\hbar\omega \log_e(r_1 r_2 / z_n)} \log_e \frac{|z_n|}{|z_m|},$$

where $P_{m,out}$ and $P_{n,out}$ are the output powers of modes m and n, respectively, $r_1$ and $r_2$ are the dimensionless complex amplitude reflectivities of the first and second mirrors, respectively, $z_m$ and $z_n$ are the dimensionless feedback parameters of modes m and n, respectively, $R_{sp}$ is the spontaneous emission rate [sec$^{-1}$], $\hbar$ is Planck's constant [Joule.sec], and $\omega$ is the instantaneous frequency of operation [radians/sec].

Physically, a SMSR of greater than roughly 40 dB means that when a particular mode (i.e. frequency) is lasing, the power output of its adjacent (undesirable) modes is adequately suppressed.

The required value of sidemode suppression that is targeted depends on the performance requirements for a given system. A typical telecommunications system might require an SMSR value of at least 30 or 40 dB, while a more demanding system, such as a coherent communications transmitter, may require an SMSR of at least 60 dB.

Figure 8:
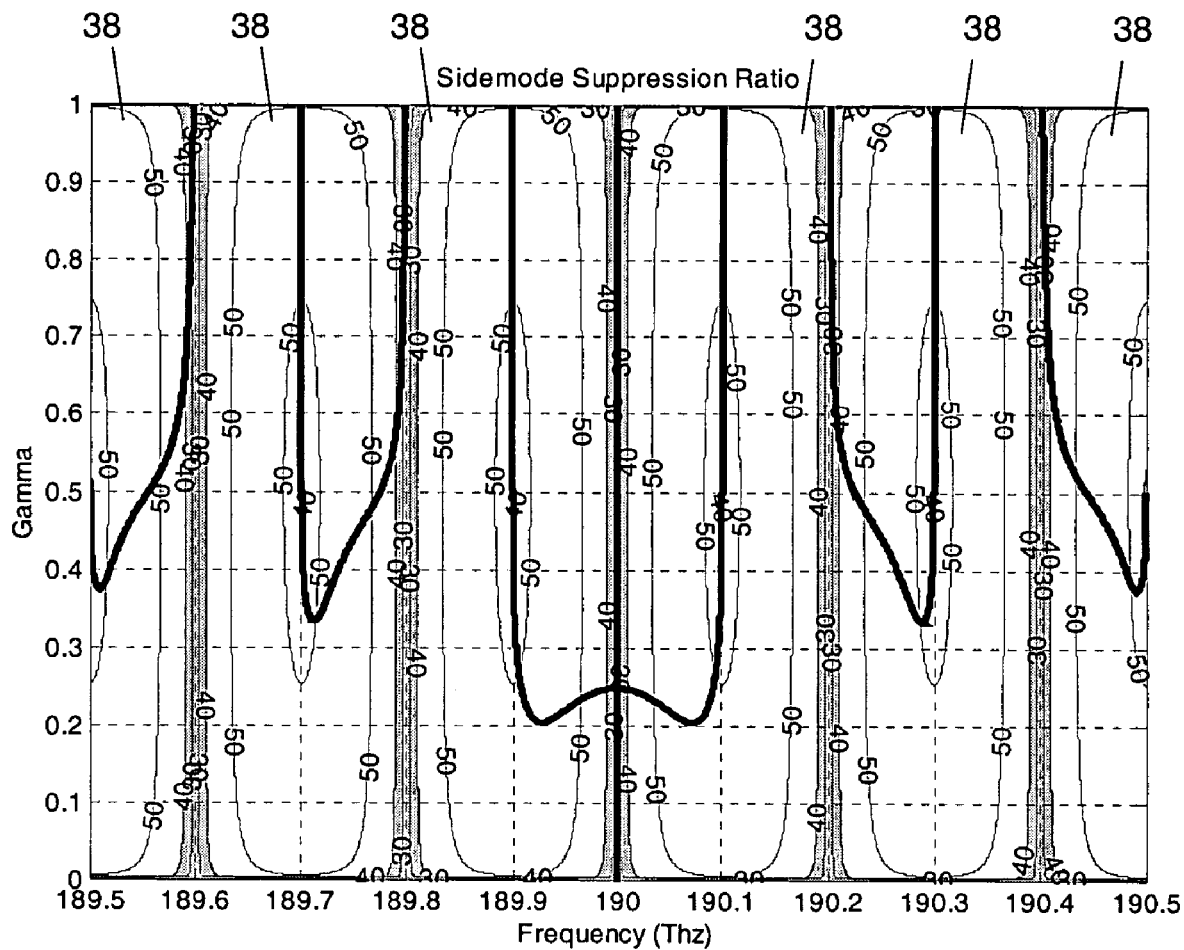
FIG. 8 is an illustrative contour plot of side mode suppression ratio, as a function of optical frequency and $\Gamma$, for an in-phase external cavity.
Figure 9:
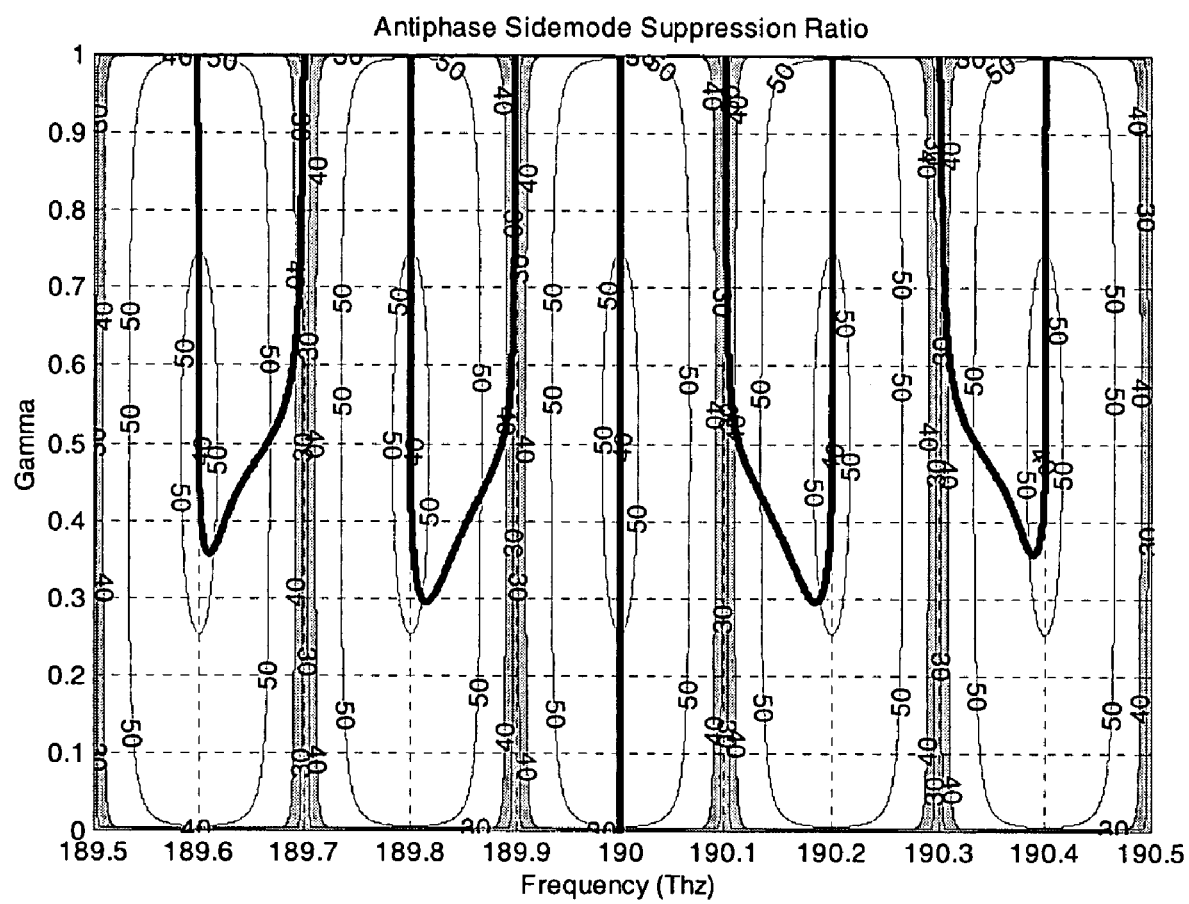
FIG. 9 is an illustrative contour plot of side mode suppression ratio, as a function of optical frequency and $\Gamma$, for an out-of-phase external cavity.

There are two extreme conditions that may be evaluated, which correspond to the feedback being (a) in phase, and (b) out of phase. It is preferable to do separate analyses for each condition. As with the case for the chirp reduction factor, a helpful representation of SMSR is a contour plot, with laser frequency ω along an x-axis, and Γ varying from 0 to 1 along a y-axis. A sample contour for feedback in phase is shown in FIG. 8, with an acceptable region 38 of Γ values producing a SMSR greater than 40 dB. The region 38 defines the second range of Γ values. A sample contour for feedback out of phase is shown in FIG. 9.

Next, consider in detail block 23, in which a third range of Γ values is established for which a phase sensitivity is acceptable. It is found that the external cavity length $L_2$ may vary slightly, depending on temperature, temperature gradients, and mechanical stress or shock. One important effect of variations in $L_2$ is that the reflections into the laser cavity from the second and third mirrors may vary in phase, and these phase variations may unpredictably (and undesirably) alter the laser performance. In order to stabilize the performance of the system, it is preferable to use a control system to precisely maintain the phase relationship between the reflections from the second and third mirrors, by either monitoring and precisely controlling the refractive index of the cavity or the external cavity length $L_2$, or by electronically adjusting the laser wavelength. A control system for a semiconductor laser in the presence of feedback is disclosed in U.S. patent application Ser. No. 10/411,636, filed Apr. 11, 2003 entitled, "Control System for a Semiconductor Laser", now U.S. Pat. No. 6,922,423 B2 which is incorporated herein in its entirety by reference thereto.

A control system preferably requires an error signal that crosses zero at the desired condition, with a large slope. The greater the slope through zero, the greater the sensitivity of the control system.

We define a sensitivity factor, S, as follows:

$$S=(r_{max}-|r_{eff}|)/r_{max}, \quad (4)$$

where $r_{max}=(r_2+r_3)/(1+r_2r_3)$, $r_{eff}=|(r_2+r_3e^{-j\phi})/(1+r_2r_3e^{-j\phi})|$, and φ is the phase between the reflected components.

Physically, when S is greater than roughly 0.03, there is enough sensitivity to generate an acceptable error signal that may be used to control the phase φ. Note that the actual acceptable value varies from one application to another.

Figure 10:
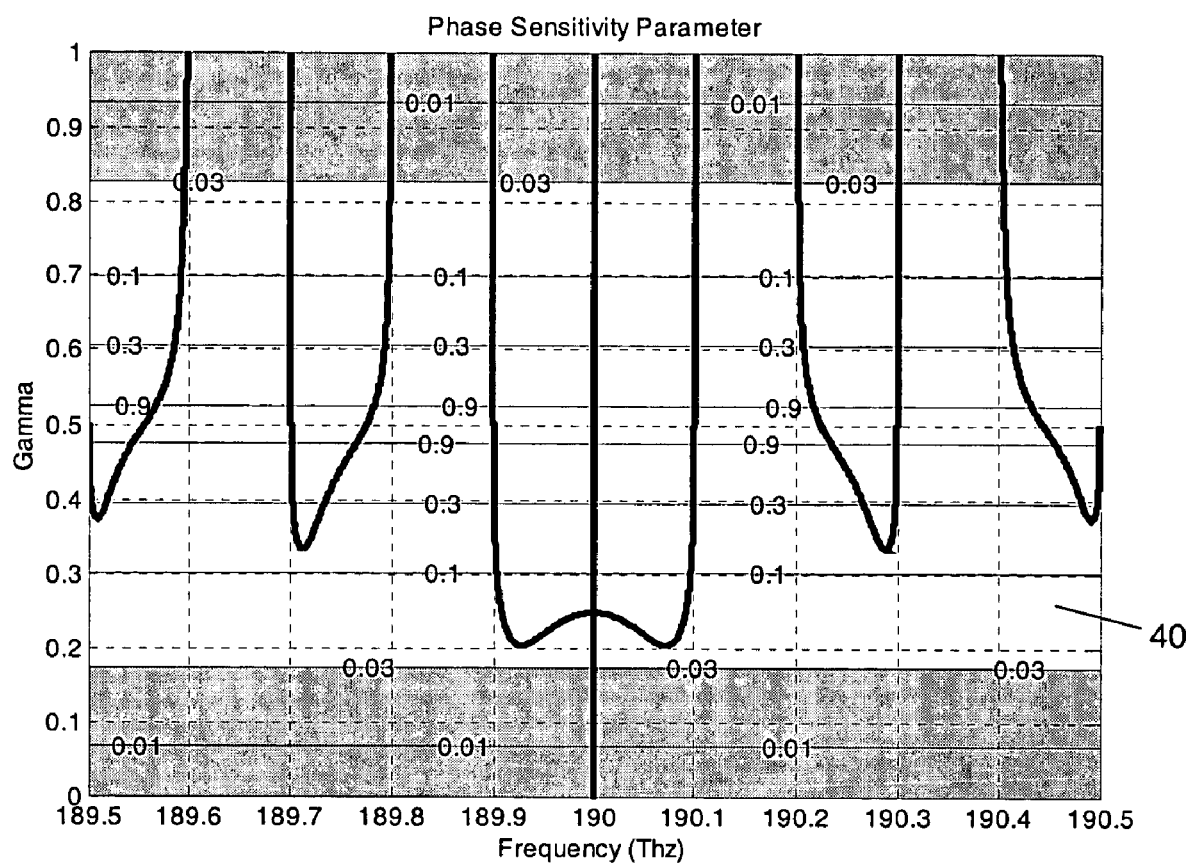
FIG. 10 is an illustrative contour plot of phase sensitivity, as a function of optical frequency and $\Gamma$.

As before, a helpful way to identify the acceptable regions of S is a contour plot, with laser frequency ω along an x-axis, and Γ varying from 0 to 1 along a y-axis. A sample contour plot is shown in FIG. 10, with an acceptable region 40. Note that the acceptable region 40 indicates an acceptable range of Γ values for each laser frequency ω, which defines the third range of Γ values.

Note that in general, the closer Γ is to a value of 0.5, the higher the phase sensitivity. The third range of Γ values is relatively insensitive to laser frequency.

Next, consider in detail block 24, in which a fourth range of Γ values is established for which a phase instability is enhanced. As discussed earlier, one important effect of variations in external cavity length $L_2$ is that the reflections into the laser cavity from the second and third mirrors may vary in relative phase, and these phase variations may unpredictably (and undesirably) alter the laser performance. In general, this fourth range of Γ identifies regions of instability, where the system is extremely sensitive to these changes in phase.

Figure 11:
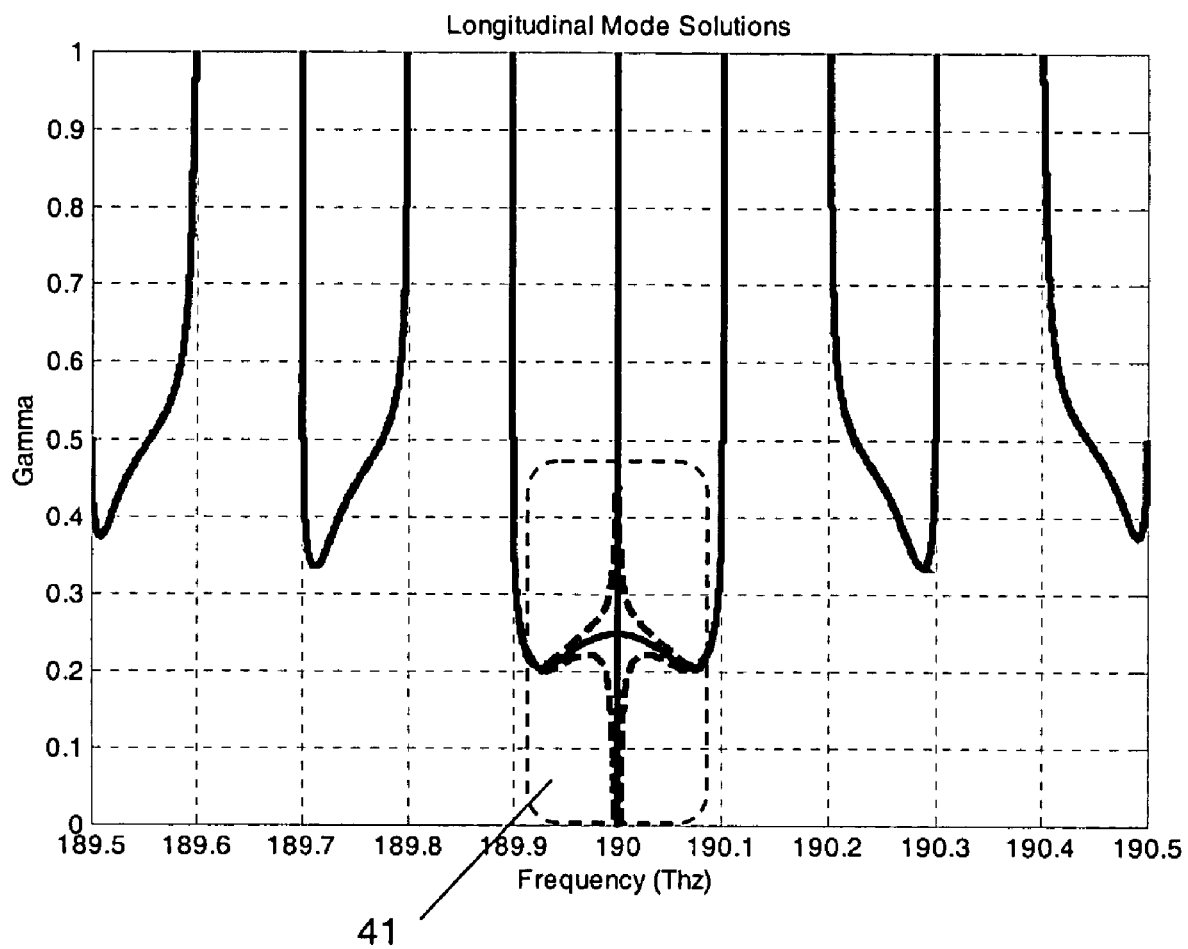
FIG. 11 is an illustrative graph of phase instability, as a function of optical frequency and $\Gamma$.

As before, a preferred method for identifying regions of Γ is a two-dimensional plot, with laser frequency and Γ plotted on the x- and y-axes, respectively. Instead of contours, though, we plot the permissible longitudinal modes, given by the equations in Appendix B. FIG. 11 shows a sample plot, in which two sets of curves are shown. The solid curves are the set of permissible longitudinal modes, and the dashed curves are the frequencies that would result if the modal round trip phase varies from zero by +/−0.0001 radians. In the regions where the solid and dashed curves are visually discernible from each other, the system is unacceptably sensitive to phase, and is considered unacceptably unstable. This region of instability, shown as 41 in FIG. 11 (i.e., the area inside the roughly rectangular dotted outline near the bottom of the plot), defines the fourth range of Γ values.

Next, consider in detail block 25, in which Γ values are identified that are common to the first, second and third ranges, but excluding Γ values in the fourth range. Because a preferred method of identifying the first, second, third and fourth ranges of Γ is on a two-dimensional plot, the plots may be superimposed to first identify the regions of overlap among the first, second and third ranges, then to exclude from the overlap the fourth range.

If there are no apparent regions of overlap among the first, second and third ranges, any of the regions may be expanded by choosing an alternative, less demanding, value as the cutoff. Naturally, such an expansion will come at the expense of performance for that particular quantity, depending on which range is expanded. By manipulating the regions of overlap in this manner, a particular design may be optimized for a particular quality, such as side mode suppression, for example.

As a second embodiment of block 13, consider the case of mode locking. FIG. 5 shows a flow chart specifying the details 135 for a laser that may be mode locked. The blocks of FIG. 5 are detailed in the sections below.

Next, consider in detail block 28, in which a fifth range of Γ values is established for which a side mode suppression ratio is acceptable. Block 28 uses the same methodology of block 22, except with different threshold values.

When designing a laser for mode locking, it is preferable to have a large number of strong side modes present (in contrast to the chirp reduction case of block 28, in which we actively suppress the side modes). When mode locking, we want the output pulses as short as possible, and in general, want the number of lasing modes as large as possible.

A further distinction from block 22 is that we need not treat the cases of in-phase and out-of-phase separately. This arises, because as Γ approaches 1, there is little physical distinction between the set of laser modes in the in-phase and out-of-phase cases. We implicitly assume that the reflections are in-phase.

Next, consider in detail block 29, in which Γ values are established. The Γ values selected are simply those contained in the fifth range, identified in block 28.

Once a set of Γ values is identified by block 13 (as shown in two exemplary embodiments in FIGS. 4 and 5), we proceed to block 14, as shown in process 10 of FIG. 2.

In block 14, a three-mirror laser is designed. Noting that $r_{max}=\sqrt{R_{max}}$, we may first solve for the amplitude reflectivities $r_2$ and $r_3$ of the second and third mirrors:

$$r_2 = \frac{1+\left(\frac{\Gamma}{1-\Gamma}\right)^{1/2} - \left(\frac{\left(\frac{\Gamma}{1-\Gamma}\right)^{1/2} - 2\Gamma + 4\Gamma r_{max}^2}{\left(\frac{\Gamma}{1-\Gamma}\right)^{1/2}(\Gamma-1)}\right)^{1/2}}{2r_{max}} \quad (5)$$

-continued $$r_3 = r_2\sqrt{\frac{1-\Gamma}{\Gamma}} \tag{6}$$

$$= \frac{1+\left(\frac{1-\Gamma}{\Gamma}\right)^{1/2} - \left(\frac{\left(\frac{\Gamma}{1-\Gamma}\right)^{1/2} - 2\Gamma + 4\Gamma r_{max}^2}{\Gamma\left(\frac{\Gamma}{1-\Gamma}\right)^{1/2}}\right)^{1/2}}{2r_{max}}$$

We then square these amplitude coefficients to obtain the power reflectivities $R_2$ and $R_3$ of the second and third mirrors: $R_2 = r_2^2$ and $R_3 = r_3^2$.

The reflectivity $R_1$ of the first mirror 4 is substantially the same as the reflectivity $R_1$ of the high-reflectivity mirror 40, obtained from block 11. The laser cavity 2 length $L_1$ is obtained from block 11. The external cavity 3 length $L_2$ is obtained from block 12.

Finally, as shown in block 15, a three-mirror laser may be constructed. Given the values of the three mirror reflectivities and the two spacings, obtained from block 14, we may now fabricate the three-mirror laser 1 of FIG. 1. Suitable fabrication techniques are well known in the art.

Derivation of the Generalized Rate Equations with Feedback

In this section, we derive the rate equations for the case of an arbitrary level of optical feedback. In the treatment of Lang and Kobayashi, the effect of feedback is considered as a perturbation on a steady state lasing condition with no feedback. In this approach, as the level of feedback becomes stronger, it becomes necessary to consider progressively more terms in what is in fact an infinite series expansion in the time domain for the total feedback into the laser cavity, as is treated in Law and Agrawal, resulting in an infinite set of equations to solve in order to take into account arbitrarily strong feedback.

Conceptually, our analysis relies on the fact that, in the frequency domain, it is possible to explicitly perform the infinite summation of time delayed feedback signals that leads to an infinite set of time domain rate equations. An effective way to proceed in this manner is to combine the standard rate equations of Agrawal and Dutta (in Chapter 6 of Semiconductor Lasers, 2nd edition 1993) with Osmundsen and Gade's treatment of a virtual mirror (IEEE Journal of Quantum Electronics, Volume 19 Number 3 p 465–469) to arrive at a set of rate equations that fully describe the impact of optical feedback for arbitrary feedback levels.

To derive this set of rate equations, we proceed starting from Agrawal and Dutta. We have the standard rate equation set as follows:

$$\dot{P} = (G-\gamma)P + R_{sp} + F_P(t) \tag{7}$$

$$\dot{N} = I/q - \gamma_e N - GP + F_N(t)$$

$$\dot{\varphi} = -(\omega - \omega_{th}) + \frac{1}{2}\beta_c(G-\gamma) + F_\varphi(t)$$

where P is the dimensionless photon cavity number, G is the net rate of stimulated emission [sec$^{-1}$], $\gamma$ is the photon decay rate [sec$^{-1}$], $R_{sp}$ is the spontaneous emission rate [sec$^{-1}$], $F_P(t)$ is the Langevin photon noise [sec$^{-1}$], N is the dimensionless carrier number, I is the injected current [amperes], q is the electronic charge [coulombs], $\gamma_c$ is the carrier recombination rate [sec$^{-1}$], $F_n(t)$ is Langevin electron noise [sec$^{-1}$], $\phi$ is the phase of the electric field [radians], $\omega$ is the instantaneous frequency of operation [radians/sec], $\omega_{th}$ is the periodic boundary condition frequency [radians/sec], and $\beta_c$ is the dimensionless linewidth enhancement factor.

For an external cavity, we can capture all of the physics of the modified compound cavity by introducing the concept of an effective mirror reflectivity for the mirror, $r_{2eff}$, which takes into account the effects of the mirror $r_2$ and $r_3$ combined (from Osmundsen and Gade):

$$r_{2eff} = r_2\frac{1+r_3/r_2 e^{-j\varphi_0}}{1+r_2r_3 e^{-j\varphi_0}} = \frac{r_2}{z} = r_2|z|^{-1}e^{-\arg(z)}, \tag{8}$$

where lower case "r"s denote amplitude reflectivity, a complex value (and upper case "R"s denote power reflectivity, a real value), and $$z = \frac{1+r_2r_3 e^{-j\varphi_0}}{1+r_3/r_2 e^{-j\varphi_0}}. \tag{9}$$

This expression, taken from Osmundsen and Gade, introduces the concept of the feedback parameter, z. This expression for $r_{2eff}$ can be shown to be equivalent to the similar expression that Coldren and Corzine have used for $r_{2eff}$, where they write:

$$r_{2eff} = r_2 + \frac{t_2^2 r_3 e^{-j\varphi_0}}{1+r_2r_3 e^{-j\varphi_0}} \tag{10}$$

As a result of the interaction between $r_2$ and $r_3$, the effective reflectivity becomes complex and frequency dependent.

This modifies two quantities in the rate equations above, the photon decay rate, $\gamma$, and the periodic boundary condition frequency, $\omega_{th}$. These modifications affect the photon number rate equation and the phase rate equation, while leaving the carrier number rate equation unchanged. We first derive expressions for the modified photon decay rate and modified periodic boundary condition as a function of the feedback parameter, z.

First for the photon decay rate, $\gamma'$:

$$\gamma = v_g(\alpha_m + \alpha_{int}) \tag{11}$$

$$\alpha_m = \frac{1}{2L}\ln\left(\frac{1}{R_1R_2}\right)$$

$$\alpha'_m = \frac{1}{2L}\left[\ln\left(\frac{1}{R_1}\right) + \ln\left(\frac{1}{|r_{2eff}|^2}\right)\right] = \alpha_m + \frac{1}{L}\ln|z|$$

$$\gamma' = v_g(\alpha'_m + \alpha_{int}) = v_g\left(\alpha_m + \frac{1}{L}\ln|z| + \alpha_{int}\right)$$

$$\gamma' = \gamma + \frac{v_g}{L}\ln|z|$$

Then, for the threshold phase:

-continued $$\omega_{th} = \frac{\pi mc}{\mu L} \quad (12)$$

$$2\mu k_0 L - \arg(z) = 2m\pi$$

$$k_0 = \frac{2\pi v}{c}$$

$$2\mu \frac{2\pi v}{c} L = 2m\pi + \arg(z)$$

$$v_m = [2m\pi + \arg(z)]\frac{c}{4\mu\pi L} = \frac{mc}{2\mu L} + \frac{\arg(z) \times c}{4\pi\mu L}$$

$$\omega'_{th} = 2\pi v_m = \frac{\pi mc}{\mu L} + \frac{\arg(z) \times c}{2\mu L}$$

$$\omega'_{th} = \omega_{th} + \frac{\arg(z) \times c}{2\mu L}$$

By replacing $\omega_{th}$ and $\gamma$ in the non-feedback rate equations above with $\omega'$ and $\gamma'$ as derived above, we can account for the complete effects of the optical feedback for arbitrary magnitude of feedback. The result of this insertion, with some straightforward algebra, is the operative set of rate equations:

$$\dot{P} = (G - \gamma)P - \left(\frac{v_g}{2L}\ln|z|\right)P + R_{sp} + F_P(t) \quad (13)$$

$$\dot{N} = I/q - \gamma_e N - GP + F_N(t)$$

$$\dot{\varphi} = -(\omega - \omega_{th}) + \frac{1}{2}\beta_c(G - \gamma) +$$

$$\frac{1}{2L}\left[\frac{\arg(z) \times c}{\mu} - \frac{\beta_c v_g \ln|z|}{2}\right] + F_\varphi(t)$$

$$z = \frac{1 + r_2 r_3 e^{-j\varphi_0}}{1 + r_3/r_2 e^{-j\varphi_0}}$$

Calculations of the Longitudinal Mode Frequencies

Our goal in this section is to calculate the modal frequencies for operation of the laser. (i.e., the optical frequencies at which a given cavity of length L will lase with a given output power P.) In this regime, the laser operates at steady-state, meaning that time derivatives may be all set to zero. Additionally, while lasing, the laser power P is much larger than the Langevin power noise or the spontaneous emission power, so that the term involving these quantities may be neglected. One arrives at the following set of equations:

$$\dot{P} = (G - \gamma)P - \left(\frac{v_g}{2L}\ln|z|\right)P + R_{sp} + F_p(t) = 0 \quad (14)$$

$$\dot{N} = I/q - \gamma_e N - GP + F_N(t) = 0$$

$$\dot{\varphi} = -(\omega - \omega_{th}) + \frac{1}{2}\beta_c(G - \gamma) +$$

$$\frac{1}{2L}\left[\frac{\arg(z) \times c}{\mu} - \frac{\beta_c v_g \ln|z|}{2}\right] + F_\varphi(t) = 0$$

Setting the time derivatives equal to zero and rearranging rearranging (i.e., solving the photon equation for $\Gamma$, and inserting this into the phase equation), we arrive at $$0 = -(\omega - \omega_{th}) + \frac{1}{2L}\left[\frac{\arg(z) \times c}{\mu}\right] + F_\varphi(t), \quad (15)$$

when $$F_\varphi(t) >> \frac{1}{2}\beta_c \frac{R_{sp} + F_P(t)}{P}, \quad (16)$$

where $\omega$ is the instantaneous frequency of operation [radians/sec], $\omega_{th}$ is the periodic boundary condition frequency [radians/sec], L is the cavity length [m], z is the dimensionless feedback parameter, c is the speed of light in a vacuum [m/sec], $\mu$ is the dimensionless permeability of the laser cavity, $F_\varphi(t)$ is Langevin electric field noise [sec$^{-1}$], $\beta_c$ is the dimensionless linewidth enhancement factor, $R_{sp}$ is the spontaneous emission rate [sec$^{-1}$], $F_p(t)$ is the Langevin photon noise [sec$^{-1}$], and P is the dimensionless photon cavity number.

Due to the dependence of z on optical frequency, this expression represents a transcendental equation for the laser emission wavelengths $\omega$. Due to the periodic nature of z, the solutions to this transcendental equation will, under many circumstances, be multivalued.

In contrast to the conventional treatments based on the treatment of Lang and Kobayashi, where feedback is considered as a perturbation of a steady state condition with zero feedback, the present analysis yields a set of modal solutions that are correct for all strengths of the perturbation and independent of the linewidth enhancement factor under lasing conditions.

The description of the invention and its applications as set forth herein is illustrative and is not intended to limit the scope of the invention. Variations and modifications of the embodiments disclosed herein are possible, and practical alternatives to and equivalents of the various elements of the embodiments would be understood to those of ordinary skill in the art upon study of this patent document. For example, where calculation methods are described herein, various other algebraic manipulations and numerical analytical methods would be understood. These and other variations and modifications of the embodiments disclosed herein may be made without departing from the scope and spirit of the invention.

The invention claimed is:

1. A method of defining a three-mirror laser having a laser cavity and an external cavity, the laser cavity comprising a first mirror and a second mirror, and the external cavity comprising the second mirror and a third mirror, the method comprising:
    specifying a precursor single-cavity laser having a high reflectivity mirror of power reflectivity $R_1$, an effective mirror of power reflectivity $R_{max}$, and a length $L_1$;
    establishing a length $L_2$ of the external cavity;
    establishing $\Gamma$ for the external cavity; and
    calculating a power reflectivity $R_2$ for the second mirror and a power reflectivity $R_3$ for the third mirror from the $\Gamma$ and the power reflectivity $R_{max}$ where $R_{max}$ is the net reflectivity of $R_2$ and $R_3$ when the reflectivities of $R_2$ and $R_3$ are in-phase;
    wherein the three-mirror laser is defined by the values of $L_1$, $L_2$, $R_1$, $R_2$ and $R_3$.

2. The method of claim 1 wherein the $L_2$ establishing step comprises establishing the length $L_2$ greater than the length $L_1$ and based on a round trip time less than a data transmission bit length.

3. The method of claim 1 wherein the power reflectivity calculating step comprises:

$$\left| \frac{1 + \left(\frac{\Gamma}{1-\Gamma}\right)^{1/2} - \left(\frac{\left(\frac{\Gamma}{1-\Gamma}\right)^{1/2} - 2\Gamma + 4\Gamma R_{max}}{\left(\frac{\Gamma}{1-\Gamma}\right)^{1/2}(\Gamma-1)}\right)^{1/2}}{2\sqrt{R_{max}}} \right|^2 ; \text{ and}$$

calculating a power reflectivity $R_3$ for the third mirror equals $$\left| \frac{1 + \left(\frac{\Gamma}{1-\Gamma}\right)^{1/2} - \left(\frac{\left(\frac{\Gamma}{1-\Gamma}\right)^{1/2} - 2\Gamma + 4\Gamma R_{max}}{\left(\frac{\Gamma}{1-\Gamma}\right)^{1/2}}\right)^{1/2}}{2\sqrt{R_{max}}} \right|^2 ;$$

4. The method of claim 1 wherein the $\Gamma$ establishing step comprises:
  obtaining a first range of $\Gamma$ values for which a chirp reduction factor is acceptable;
  obtaining a second range of $\Gamma$ values for which a Side Mode Suppression Ratio ("SMSR") is acceptable;
  obtaining a third range of $\Gamma$ values for which a phase sensitivity is acceptable;
  obtaining a fourth range of $\Gamma$ values for which phase instability is enhanced;
  identifying $\Gamma$ values common to the first, second and third ranges, excluding $\Gamma$ values in the fourth range; and
  selecting the $\Gamma$ from the common $\Gamma$ values.

5. The method of claim 1 wherein the $\Gamma$ establishing step comprises:
  obtaining a first range of $\Gamma$ values for which a chirp reduction factor is greater than a chirp reduction factor threshold value;
  obtaining a second range of $\Gamma$ values for which a Side Mode Suppression Ratio ("SMSR") is greater than a SMSR threshold value;
  obtaining a third range of $\Gamma$ values for which a phase sensitivity is greater than a phase sensitivity threshold value;
  obtaining a fourth range of $\Gamma$ values for which two sets of longitudinal mode solutions diverge, the two sets being closely-spaced in phase upon reflection between the second and third mirrors;
  identifying $\Gamma$ values common to the first, second and third ranges, excluding $\Gamma$ values in the fourth range; and
  selecting the $\Gamma$ from the common $\Gamma$ values.

6. The method of claim 5 wherein:
  the chirp reduction factor threshold value is 100;
  the SMSR threshold value is 40 dB;
  the phase sensitivity value is 0.03; and
  the two sets are spaced apart by 0.0001 radians.

7. The method of claim 5 wherein the $\Gamma$ establishing step comprises:
  obtaining a fifth range of $\Gamma$ values for which a Side Mode Suppression Ratio ("SMSR") is acceptable; and
  selecting the $\Gamma$ from the fifth range of $\Gamma$ values.

8. The method of claim 1 wherein the $\Gamma$ establishing step comprises:
  obtaining a fifth range of $\Gamma$ values for which a Side Mode Suppression Ratio ("SMSR") is less than a SMSR threshold value; and
  selecting the $\Gamma$ from the fifth range of $\Gamma$ values.

9. A method of defining a three-mirror laser having a laser cavity and an external cavity, the laser cavity comprising a first mirror and a second mirror, and the external cavity comprising the second mirror and a third mirror, the method comprising:
  specifying a precursor laser having a high reflectivity mirror of power reflectivity $R_1$, an effective mirror of power reflectivity $R_{max}$, and a length $L_1$;
  establishing a length $L_2$ of the external cavity;
  obtaining a first range of $\Gamma$ values for which a chirp reduction factor is acceptable;
  obtaining a second range of $\Gamma$ values for which a Side Mode Suppression Ratio ("SMSR") is acceptable;
  obtaining a third range of $\Gamma$ values for which a phase sensitivity is acceptable;
  obtaining a fourth range of $\Gamma$ values for which phase instability is enhanced;
  identifying $\Gamma$ values common to the first, second and third ranges, excluding $\Gamma$ values in the fourth range;
  selecting the $\Gamma$ from the common $\Gamma$ values;
  calculating a power reflectivity $R_2$ for the second mirror $$\left| \frac{1 + \left(\frac{\Gamma}{1-\Gamma}\right)^{1/2} - \left(\frac{\left(\frac{\Gamma}{1-\Gamma}\right)^{1/2} - 2\Gamma + 4\Gamma R_{max}}{\left(\frac{\Gamma}{1-\Gamma}\right)^{1/2}(\Gamma-1)}\right)^{1/2}}{2\sqrt{R_{max}}} \right|^2 ; \text{ and}$$

calculating a power reflectivity $R_3$ for the third mirror equals $$\left| \frac{1 + \left(\frac{\Gamma}{1-\Gamma}\right)^{1/2} - \left(\frac{\left(\frac{\Gamma}{1-\Gamma}\right)^{1/2} - 2\Gamma + 4\Gamma R_{max}}{\left(\frac{\Gamma}{1-\Gamma}\right)^{1/2}}\right)^{1/2}}{2\sqrt{R_{max}}} \right|^2 ;$$

10. A method of defining a three-mirror laser having a laser cavity and an external cavity, the laser cavity comprising a first mirror and a second mirror, and the external cavity comprising the second mirror and a third mirror, the method comprising:
  specifying a precursor laser having a high reflectivity mirror of power reflectivity $R_1$, an effective mirror of power reflectivity $R_{max}$, and a length $L_1$;
  establishing a length $L_2$ of the external cavity;
  obtaining a range of $\Gamma$ values for which a Side Mode Suppression Ratio ("SMSR") is acceptable;
  selecting the $\Gamma$ from the range of $\Gamma$ values;
  calculating a power reflectivity $R_2$ for the second mirror $$\text{equals} \left| \frac{1 + \left(\frac{\Gamma}{1-\Gamma}\right)^{1/2} - \left(\frac{-\left(\frac{\Gamma}{1-\Gamma}\right)^{1/2} - 2\Gamma + 4\Gamma R_{max}}{\left(\frac{\Gamma}{1-\Gamma}\right)^{1/2}(\Gamma-1)}\right)^{1/2}}{2\sqrt{R_{max}}} \right|^2 ; \text{ and}$$

calculating a power reflectivity $R_3$ for the third mirror

-continued $$\text{equals} \left| \frac{1 + \left(\frac{1-\Gamma}{\Gamma}\right)^{1/2} - \left(\frac{-\left(\frac{\Gamma}{1-\Gamma}\right)^{1/2} - 2\Gamma + 4\Gamma R_{max}}{\Gamma\left(\frac{\Gamma}{1-\Gamma}\right)^{1/2}}\right)^{1/2}}{2\sqrt{R_{max}}} \right|^2 ;$$

wherein the three-mirror laser is defined by the values of $L_1$, $L_2$, $R_1$, $R_2$ and $R_3$.

11. A method of defining a three-mirror laser comprising:
    establishing a laser cavity having a length $L_1$ and comprising a first mirror of power reflectivity $R_1$ and a second mirror;
    establishing an external cavity having a length $L_2$ and comprising the second mirror with power reflectivity $R_2$ and a third mirror with a power reflectivity $R_3$;
    determining the power reflectivities $R_2$ and $R_3$ by rate equations that are valid for any arbitrary level of optical feedback.

12. The method of claim 11 wherein the rate equations are given by the operative set of rate equations (13).

13. A vertical cavity surface emitting laser comprising:
    a vertical laser cavity having a length $L_1$ and comprising a high reflectivity first mirror of power reflectivity $R_1$ and a second mirror of power reflectivity $R_2$;
    a vertical external cavity having a $\Gamma$ value and a length $L_2$ and comprising the second mirror $R_2$ and a third mirror of power reflectivity $R_3$, where $\Gamma = R_3/(R_2+R_3)$;
    wherein the power reflectivity $R_2$ and the power reflectivity $R_3$ are functions of the $\Gamma$ value and a power reflectivity $R_{max}$ determined for a precursor two mirror laser having the first mirror and an effective mirror of the power reflectivity $R_{max}$.

14. The laser of claim 13 wherein the length $L_2$ is greater than the length $L_1$ and is based on a round trip time less than a data transmission bit length.

15. The laser of claim 13 wherein:

$$R_2 \text{ equals} \left| \frac{1 + \left(\frac{\Gamma}{1-\Gamma}\right)^{1/2} - \left(\frac{\left(\frac{\Gamma}{1-\Gamma}\right)^{1/2} - 2\Gamma + 4\Gamma R_{max}}{\left(\frac{\Gamma}{1-\Gamma}\right)^{1/2}(\Gamma - 1)}\right)^{1/2}}{2\sqrt{R_{max}}} \right|^2 ; \text{ and}$$

-continued $$R_3 \text{ equals} \left| \frac{1 + \left(\frac{1-\Gamma}{\Gamma}\right)^{1/2} - \left(\frac{\left(\frac{\Gamma}{1-\Gamma}\right)^{1/2} - 2\Gamma + 4\Gamma R_{max}}{\Gamma\left(\frac{\Gamma}{1-\Gamma}\right)^{1/2}}\right)^{1/2}}{2\sqrt{R_{max}}} \right|^2 .$$

16. The laser of claim 13 wherein the $\Gamma$ value is common to a first range of $\Gamma$ values for which a chirp reduction factor is acceptable, a second range of $\Gamma$ values for which a Side Mode Suppression Ratio ("SMSR") is acceptable, and a third range of $\Gamma$ values for which a phase sensitivity is acceptable, and is not within a fourth range of $\Gamma$ values for which phase instability is enhanced.

17. The laser of claim 13 wherein the $\Gamma$ value is common to a first range of $\Gamma$ values for which a chirp reduction factor is greater than a chirp reduction factor threshold value, a second range of $\Gamma$ values for which a Side Mode Suppression Ratio ("SMSR") is greater than a SMSR threshold value, and a third range of $\Gamma$ values for which a phase sensitivity is greater than a phase sensitivity threshold value, and is not within a fourth range of $\Gamma$ values for which two sets of longitudinal mode solutions diverge, the two sets being closely-spaced in phase upon reflection between the second and third mirrors.

18. The laser of claim 17 wherein:
    the chirp reduction factor threshold value is 100;
    the SMSR threshold value is 40 dB;
    the phase sensitivity value is 0.03; and
    the two sets are spaced apart by 0.0001 radians.

19. The laser of claim 13 wherein the $\Gamma$ value is within a range of $\Gamma$ values for which a Side Mode Suppression Ratio ("SMSR") is acceptable.

20. The laser of claim 13 wherein the $\Gamma$ value is within a range of $\Gamma$ values for which a Side Mode Suppression Ratio ("SMSR") is less than a SMSR threshold value.

21. A three-mirror laser comprising:
    a laser cavity having a length $L_1$ and comprising a first mirror of power reflectivity $R_1$ and a second mirror of power reflectivity $R_2$; and
    an external cavity having a length $L_2$ and comprising the second mirror and a third mirror of power reflectivity $R_3$;
    wherein the power reflectivities $R_2$ and $R_3$ are at least in part determined by rate equations that are valid for any arbitrary level of optical feedback.

22. The laser of claim 21 wherein the rate equations are given by the operative set of rate equations (13).

* * * * *